United States Patent [19]
Vasquez et al.

[11] Patent Number: 5,455,194
[45] Date of Patent: Oct. 3, 1995

[54] ENCAPSULATION METHOD FOR LOCALIZED OXIDATION OF SILICON WITH TRENCH ISOLATION

[75] Inventors: Barbara Vasquez, Austin, Tex.; Michael P. Masquelier, Phoenix, Ariz.; Scott S. Roth, Austin, Tex.

[73] Assignee: Motorola Inc., Schaumburg, Ill.

[21] Appl. No.: 398,844

[22] Filed: Mar. 6, 1995

[51] Int. Cl.$^6$ .................................................... H01L 21/76
[52] U.S. Cl. ................................ 437/67; 437/72; 437/73; 148/DIG. 50
[58] Field of Search ................................ 437/67, 72, 73, 437/69; 148/DIG. 50

[56] References Cited

U.S. PATENT DOCUMENTS

| | | | |
|---|---|---|---|
| 3,961,999 | 6/1976 | Antipov | 148/175 |
| 4,435,446 | 3/1984 | Marston et al. | 427/93 |
| 4,906,585 | 3/1990 | Neppi et al. | 437/34 |
| 4,927,780 | 5/1990 | Roth et al. | 437/69 |
| 5,116,779 | 5/1992 | Iguchi | 437/67 |
| 5,175,123 | 12/1992 | Vasquez et al. | 437/70 |
| 5,246,537 | 9/1993 | Cooper et al. | 156/656.1 |
| 5,360,753 | 11/1994 | Park et al. | 437/67 |
| 5,387,538 | 2/1995 | Moslehi | 437/67 |

FOREIGN PATENT DOCUMENTS 0589124  3/1994  European Pat. Off. ................. 437/69

OTHER PUBLICATIONS

Anipov, "Method for Forming Shallow Junction Semiconductor Devices", IBM Technical Disclosure Bulletin, vol. 21, 12 May 1979, pp. 4868–4870.

D. Simeonov, et al., "Application of the Polysilicon Edge Sealed LOCOS Process in Scaled VLSI Circuit Fabrication", 2218 Microelectronics Journal, Sep./Oct. 1988, pp. 11–18.
Ghandhi, "VLSI Fabrication Principles" Silicon and Gallium Arsenide, 1983 by John Wiley & Sons, pp. 372–373.
Wolf et al., "Silicon Processing for the VLSI Era", 1986 by Lattice Press, vol. 1:Process Tech. pp. 216–218.
Roth et al., "Characterization of Polysilicon-Encapsulated Local Oxidation", 1992 IEEE, vol. 39, No. 5, May 1992, pp. 1085–1089.
Roth et al., "Polysilicon Encapsulated Local Oxidation", IEEE Electron Device Ltrs., vol. 12, No. 3, Mar. 1991, pp. 92–94.

Primary Examiner—Brian E. Hearn
Assistant Examiner—Trung Dang
Attorney, Agent, or Firm—Jasper W. Dockrey

[57] ABSTRACT

A method for the fabrication of a trench isolation region (44) includes the deposition of first, second, and third oxidizable layers (28, 34, 42). The first oxidizable layer (28) is deposited to overlie the surface of a trench (12) formed in a semiconductor substrate (10). The first oxidizable layer (28) also fills a recess (26) formed in a masking layer (14), and resides adjacent to the upper surface of the trench (12). After oxidizing the first oxidizable layer (28), a second oxidizable layer (34) is deposited to fill the trench (12). A third oxidizable layer (42) is deposited to overlie the second oxidizable layer (34) and fills a remaining portion of the recess (26). An oxidation process is performed to oxidize oxidizable layer (42) and a portion of second oxidizable layer (34) to form a trench isolation region (44). In an alternative embodiment of the invention, a shallow isolation region (46) is formed in proximity to the trench isolation region (44).

16 Claims, 4 Drawing Sheets

ENCAPSULATION METHOD FOR LOCALIZED OXIDATION OF SILICON WITH TRENCH ISOLATION

FIELD OF THE INVENTION

This invention relates, in general, to a method for fabricating a semiconductor device, and more particularly, to an improved LOCOS isolation process using an oxidizable layer.

BACKGROUND OF THE INVENTION

In the manufacture of semiconductor devices, typically thousands of individual transistor devices are formed upon a single silicon substrate. These devices are interconnected to form complex circuits, also known as integrated circuits, as required for a particular circuit design. Because the transistors are formed within the same substrate, the transistors must be electrically isolated except as interconnected according to the circuit design. In the absence of electrical isolation, undesired electrical connections between the transistors would cause circuit shorts. Several methods exist for device isolation and vary with the type of device being manufactured. One device isolation method widely used in the manufacture of metal-oxide-semiconductor (MOS) and bipolar-complementary-MOS (BiCMOS) devices is known as local-oxidation-of-silicon (LOCOS).

In the LOCOS process, a silicon nitride mask is used to prevent oxidation of the active surface regions of a semiconductor substrate. A pad oxide layer is formed under the silicon nitride mask to relieve stress induced in the substrate during the LOCOS oxidation process. The LOCOS process offers high reliability and proven high volume manufacturing compatibility. However, a major problem with the LOCOS technique is the loss of active surface area caused by the inability to control the lateral growth of the electrical isolation regions.

The phenomenon known as lateral encroachment occurs when the final width of the isolation region is larger than the intended width, which is defined by patterning the silicon nitride mask. The amount of encroachment is thought to be related to the pad oxide thickness near the edge of the silicon nitride mask. Oxidation under the silicon nitride mask occurs when oxygen diffuses through the pad oxide layer, and reacts with the underlying silicon substrate.

The desire to suppress the lateral encroachment experienced by the LOCOS process has led to the development of techniques intended to retard the oxygen diffusion through the pad oxide layer. One approach is to reduce the thickness of the pad oxide layer to some minimal value, thus reducing the cross-sectional area available for oxygen diffusion. Prior to silicon nitride deposition, a layer of polysilicon is deposited over the thin pad oxide layer. The layer of polysilicon is used to relieve compressive stress in the substrate. This method, known as poly-buffered-LOCOS, or PBL, achieves a slight reduction in oxide encroachment, however the process is difficult to control and requires the removal of both silicon nitride and polysilicon following the oxidation process.

Other techniques have been developed, which include covering the edge of the pad oxide layer with a second layer of silicon nitride, or a silicon dioxide layer. By covering the edge of the pad oxide layer, the pad oxide layer is protected from exposure to oxygen during the oxidation process. Also, the additional dielectric layer provides mechanical resistance to the oxidation of the silicon underlying the pad oxide layer.

More recently, LOCOS improvement techniques have been developed which reduce lateral encroachment by forming a recessed region underneath the silicon nitride layer. The recessed region is then filled with polysilicon prior to carrying out the oxidation process to form the isolation regions. This method is known as polysilicon-encapsulated-local-oxidation (PELOX) and is described by Roth, et al. in U.S. Pat. No. 4,927,780, entitled "Encapsulation Method for Localized Oxidation of Silicon." Further improvements of the PELOX method are described by Vasquez, et al. in U.S. Pat. No. 5,175,123, entitled "High-Pressure Polysilicon Encapsulated Localized Oxidation of Silicon." Although, the PELOX method is effective at reducing lateral encroachment during a LOCOS process, further development is necessary to enhance the PELOX process for the formation of deep isolation regions in semiconductor substrates. Accordingly, further improvements will be realized by the present invention, as will be evident from the description which follows.

SUMMARY OF THE INVENTION

In practicing the present invention there is provided an encapsulation process for the fabrication of isolation regions in a semiconductor substrate. In one embodiment, the process of the present invention advantageously provides a trench isolation region having minimum lateral encroachment during the heavy oxidation process used to form the trench isolation region. The process includes providing a semiconductor substrate having a trench therein. The trench is defined by a patterned masking layer overlying the surface of the substrate. The patterned masking layer includes a recess adjacent to the upper surface of the trench. A first oxidizable layer is deposited to overlie the patterned masking layer and the trench. The first oxidizable layer also fills the recess in the patterned masking layer. The first oxidizable layer is oxidized to form an insulation layer overlying the trench. A second oxidizable layer is then deposited to overlie the insulation layer and to fill the trench. A third oxidizable layer is deposited to overlie the second oxidizable layer. The third oxidizable layer is oxidized along with a portion of the second oxidizable layer to form a trench isolation region in the semiconductor substrate.

In alternative embodiments of the invention, a shallow isolation region is formed in close proximity to the trench isolation region using the same oxidation process used to form the trench isolation region. To form the shallow isolation region, the masking layer is patterned to expose a portion of the semiconductor substrate in proximity to the trench. A second recess is formed in the masking layer prior to the deposition of the third oxidation layer. The final oxidation process then forms both the trench isolation region, and a shallow isolation region in proximity to the trench isolation region. In yet another alternative embodiment, the shallow isolation region is formed by etching a shallow trench in the substrate using the making layer as an etch mask.

Figure 1:
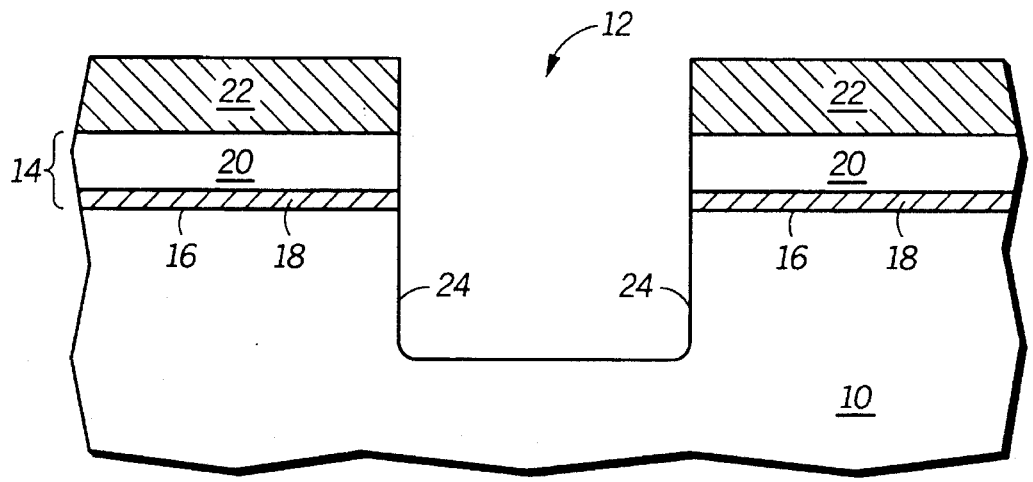
FIGS. 1–4 and 5A–5B illustrate, in cross-section, process steps in accordance with the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF PREFERRED EMBODIMENTS

The present invention provides a process for fabricating isolation regions in a semiconductor substrate. The isolation regions formed in accordance with the invention exhibit minimal lateral encroachment into regions of the silicon substrate surrounding the isolation regions. The lateral encroachment is minimized during the fabrication of both trench isolation regions and shallow isolation regions by providing a plurality of oxidizable layers, in which at least one oxidizable layer is deposited into a precisely defined recess. The recess is formed in a masking layer and surrounds the substrate region in which the isolation structure is to be formed. During the oxidation process used to form an isolation region, a portion of the oxidizable layer in the recess is converted to silicon dioxide. The minimal lateral encroachment of the isolation region provided by the present invention, permits the formation of both deep and shallow isolation regions in close proximity to each other. Deep and shallow isolation regions in close proximity can be advantageously employed for the fabrication of CMOS and BiCMOS devices. The advantages of the present invention will be better understood following a description of the inventive process as illustrated in FIGS. 1–5.

FIG. 1 illustrates, in cross-section, a portion of a semiconductor substrate 10 having already undergone several process steps in accordance with the invention. Semiconductor substrate 10 is preferably single crystal silicon. Substrate 10 can be a monolithic body of single crystal silicon, or alternatively, a single crystal silicon substrate having an epitaxial layer of silicon formed thereon. Additionally, substrate 10 can include a buried dielectric layer (not shown) as conventionally provided in a silicon-on-insulator (SOI) substrate. A trench 12 resides in substrate 10 and is defined by a patterned masking layer 14. Patterned masking layer 14 overlies a surface 16 of substrate 10. Patterned masking layer 14 includes a pad oxide layer 18 overlying substrate surface 16, and an oxidation resistant layer 20 overlying pad oxide layer 18.

Masking layer 14 is preferably formed by thermally oxidizing surface 16 to form a silicon dioxide layer thereon, then, depositing a silicon nitride layer onto the surface of the pad oxide layer. Masking layer 14 prevents the oxidation of the underlying silicon substrate during thermal oxidation processes used to form thick isolation regions. Additionally, masking layer 14 reduces tensile stress in substrate 10 during the heavy thermal oxidation process required to form thick isolation regions.

Prior to forming trench 12, a thick hard mask 22 is formed to overlie oxidation resistant layer 20. Preferably, hard mask 22 is a thick layer of silicon dioxide chemical-vapor-deposited to a thickness of about 1,000–2,000 angstroms. Once hard mask 22 is formed, a photolithographic pattern is defined (not shown) on the surface of hard mask 22, and a sequential etching process is performed to remove a portion of hard mask 22 and masking layer 14.

After a pattern has been defined on surface 16, an anisotropic silicon etch is carried out to form trench 12 in silicon substrate 10. Preferably, a reactive ion etching process is performed using chlorinated or brominated etching gases to form vertical wall surfaces 24 in silicon substrate 10. Trench 12 is etched to a varying depth into silicon substrate 10 depending upon the isolation needs of the device components to be formed in the surrounding substrate regions. For example, trench 12 can be etched to a depth ranging from about 2,000 angstroms to about 20 microns. Those skilled in the art will recognize that a hard mask is necessary because silicon etching selectivity to a lithographic resist material is not sufficient to preserve the resist during the etching process. However, in a high selective silicon etching process, a hardmask is not necessary and a conventional lithographic patterning process can be used.

Figure 2:
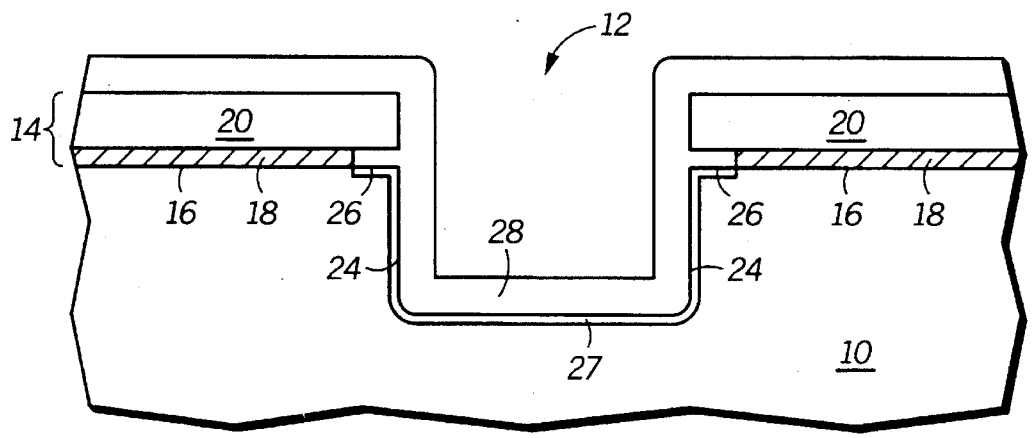

After forming trench 12, hard mask 22 is removed by means of a wet etching process, and pad oxide layer 18 is isotropically etched to create a recess 26 in patterned masking layer 14, as illustrated in FIG. 2. Recess 26 surrounds the upper surface of trench 12 and resides between surface 16 and oxidation resistant layer 20. The isotropic etching process removes a portion of pad oxide layer 18 by laterally etching away a portion of pad oxide layer 18 underlying the edge of oxidation resistant layer 20. Preferably, a wet etching process using a hydrogen fluoride solution is used to isotropically etch pad oxide layer 18. The etching solution selectively removes pad oxide layer 18, while not substantially etching either oxidation resistant layer 20 or substrate 10. As illustrated in FIG. 2, the thickness of pad oxide layer 18 defines the height of recess 26.

The lateral extent of recess 26 along surface 16 is determined by the exposure time of pad oxide layer 18 to the wet etching solution. Preferably, the wet etch process is continued for a period of time sufficient to extend recess 26 a distance of about 0.10 to 0.25 microns along surface 16 from the edge of trench 12. In an alternative embodiment, recess 26 can be formed by a dry isotropic etching process. Preferably a fluorine gas plasma is used to laterally etch pad oxide layer 18. The plasma etching process is continued for a predetermined length of time sufficient to form recess 26 to the desired lateral dimensions. The lateral extent of recess 26 is determined by the amount of lateral oxidation of oxidizable material that is expected to be consumed during subsequent oxidation processes. Preferably, the lateral extent of recess 26 should be equal to or slightly greater than the expected extent of lateral oxidation.

Once recess 26 is formed, a thin silicon reoxidation process may be carried out to form a thin reox layer 27. Then, a first oxidizable layer 28 is deposited to overlie trench 12, and to fill recess 26. As illustrated in FIG. 2, first oxidizable layer 28 overlies the surface of masking layer 14 and extends into trench 12 along vertical wall surfaces 24. First oxidizable layer 28 completely fills recess 26 and contacts the edge of pad oxide layer 18. In general, first oxidizable layer 28 should be formed to a thickness equal to or greater than about one half the thickness of pad oxide layer 18. Preferably, first oxidizable layer 28 is polycrystalline silicon or amorphous silicon chemical-vapor-deposited to a thickness of about 150 to 450 angstroms. The chemical vapor deposition process deposits the polycrystalline silicon to a uniform thickness along all surfaces of masking layer 14 and trench 12.

Figure 3:
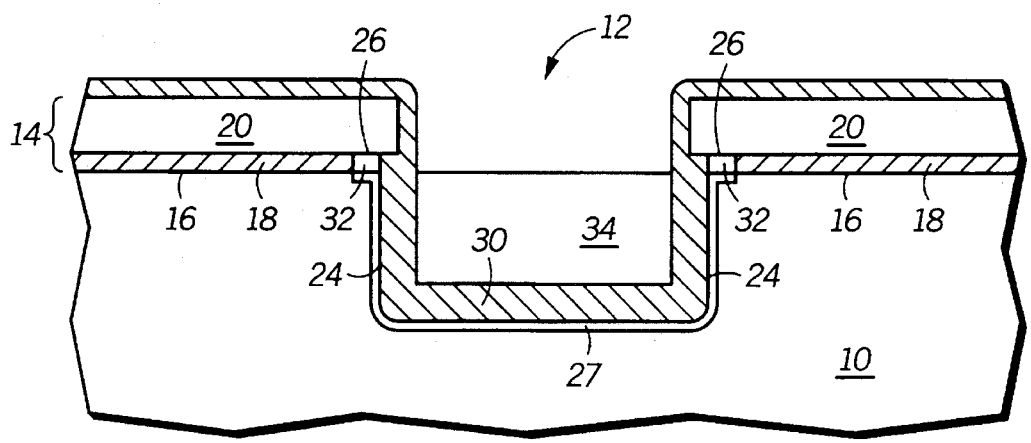

The process of the invention continues with the oxidation of first oxidizable layer 28 to form an insulation layer 30, as illustrated in FIG. 3. Insulation layer 30 is preferably formed by a thermal oxidation process, which substantially consumes first oxidizable layer 28. In the preferred embodiment, where first oxidizable layer 28 is polycrystalline silicon, oxygen gas reacts with the silicon to convert polycrystalline silicon to silicon dioxide. The reaction begins at the surface of the polycrystalline silicon layer. The oxidation reaction takes place as oxygen diffuses into the polycrystalline silicon layer. The oxidation reaction can be terminated prior to the complete consumption of polycrystalline silicon, leaving an unoxidized portions 32 in recess 26. Preferably the oxidation process is carried out for a sufficient period of time to form insulation layer 30 to a thickness of about 1,000 to 2,000 angstroms. It is important to note that if a greater dielectric thickness is desired, increased thickness can be obtained by depositing a dielectric layer directly on insulating layer 30.

After forming insulation layer 30, a plug 34 is formed in trench 12. Preferably, plug 34 is formed by chemical vapor depositing a layer of polycrystalline silicon. In general, the thickness of polycrystalline silicon required is a thickness equal to or greater than one half the width of the widest trench to be filled. Preferably, the polycrystalline silicon is deposited to a thickness of about 8,000 angstroms (not shown). The polycrystalline silicon overlies the surface of masking layer 14 and completely fills trench 12.

The polycrystalline silicon can be doped with a conductivity determining dopant either during deposition, or immediately afterwards. During deposition, the dopant species can be introduced as a component of the deposition gasses and be incorporated into the growing polysilicon film. Alternatively, a dopant can be introduced by ion implantation after the polysilicon is deposited.

Next, a layer of silicon dioxide or other planarizing material is deposited on the surface of the polycrystalline silicon (not shown). Preferably, the silicon dioxide is applied by a spin-on-glass (SOG) process. Once the glass layer is formed, both the silicon dioxide and the polycrystalline silicon are etched back, such that all of the polycrystalline silicon and the silicon dioxide overlying masking layer 14 is removed leaving a portion of the polycrystalline silicon in trench 12. Preferably, a nonselective planarization process is used to etch back the silicon dioxide or other planarizing material and the polycrystalline silicon, such that the two materials are removed at the same rate. A sputter etching process, an ion milling process, a chemical-mechanical-polishing (CMP) process, and the like, can be used to complete the etch back process.

Figure 4:
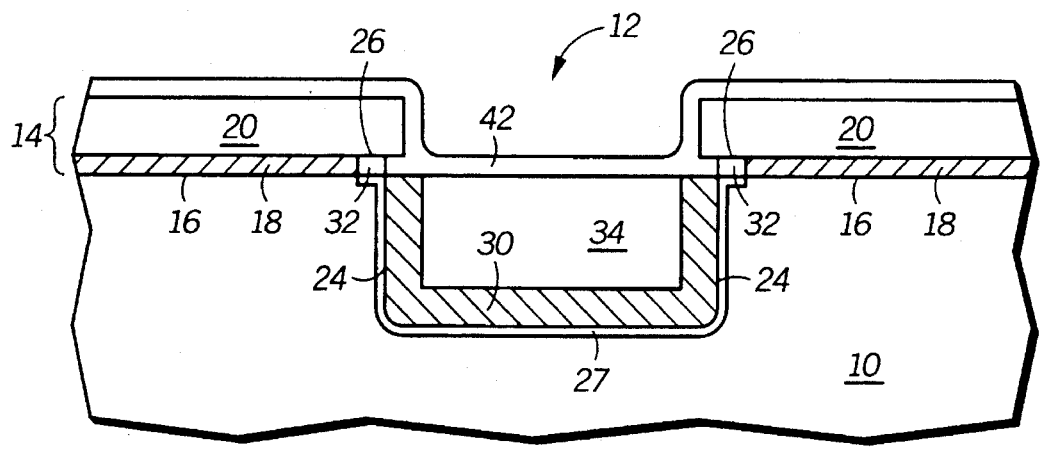

In one embodiment of the invention, following the formation of plug 34, a field oxidation process can be carried out to form an isolation region in trench 12. The inventive process continues with the formation of a photolithographic mask (not shown) overlying masking layer 14. Then, as illustrated in FIG. 4, portions of insulation layer 30 overlying oxidation resistant layer 20 are removed by means of an oxide etching process. Next, a third oxidizable layer 42 is formed to overlie masking layer 14 and plug 34. Preferably, third oxidizable layer 42 is polycrystalline silicon chemical vapor deposited to a thickness of about one half the height of recess 26. Third oxidizable layer 42 also fills exposed portions of recess 26 and contacts remaining portion 32 forming a continuous oxidizable region within recess 26.

Figure 5A:
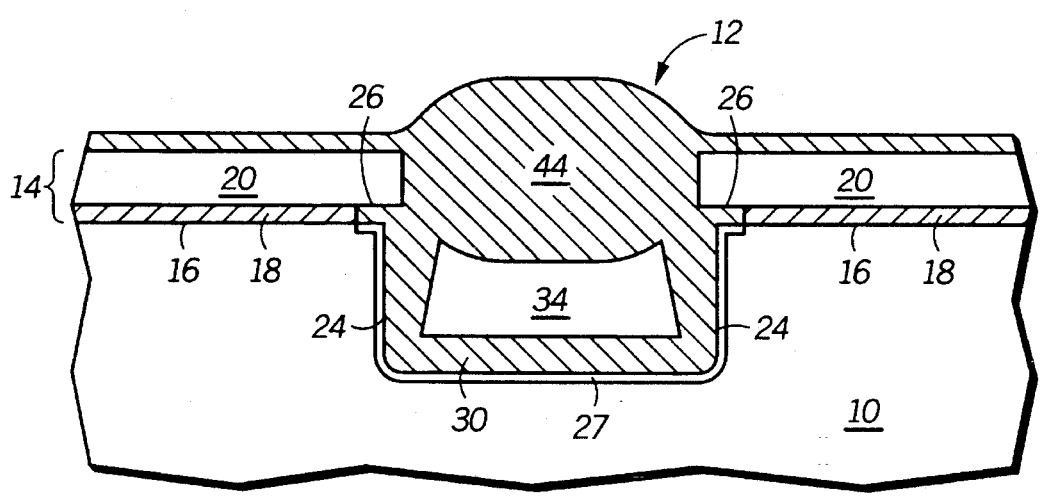

After forming third oxidizable layer 42, a field oxidation process is carried out to form a trench isolation region 44, as illustrated in FIG. 5a. The field oxidation process consumes third oxidizable layer 42 forming a layer of oxidized silicon overlying masking layer 14. Third oxidizable layer 42 reduces the lateral diffusion of oxygen through pad oxide layer 18, thus preventing the oxidation of substrate 10 underlying masking layer 14. The field oxidation process can be carried out to completely oxidize remaining portions 32 in recess 26. The structure thus formed is known in the art as a trench isolation structure and can be used to isolate substrate regions containing MOS and BiCMOS devices, and the like.

Figure 5B:
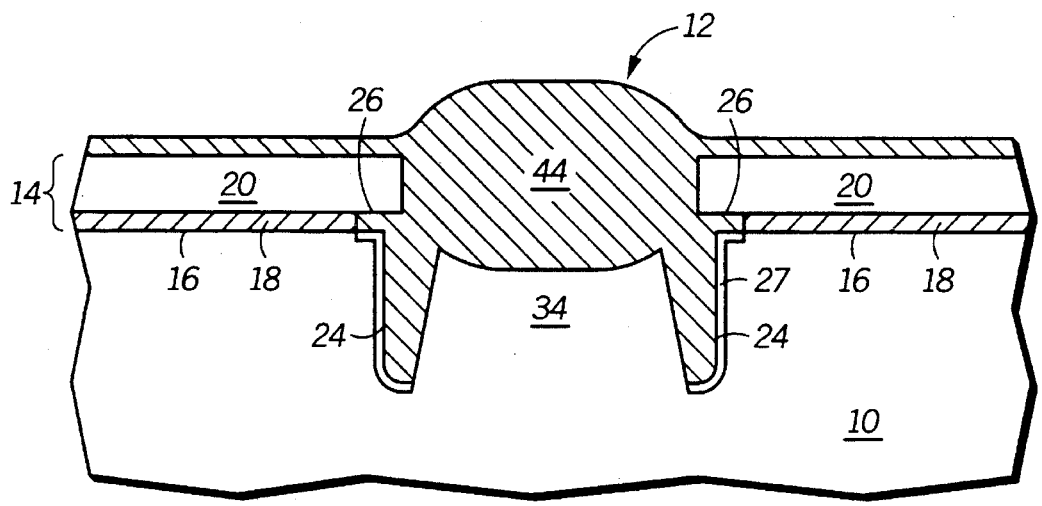

In an alternative embodiment, plug 34 can be formed by etching first oxidizable layer 28 and reox layer 27 to expose a portion of substrate 10 in the bottom of trench 12. Then, performing a selective growth or deposition process to form a plug 34. As illustrated in FIG. 5b, the selective process forms plug 34 as a pillar in trench 12.

Figure 6:
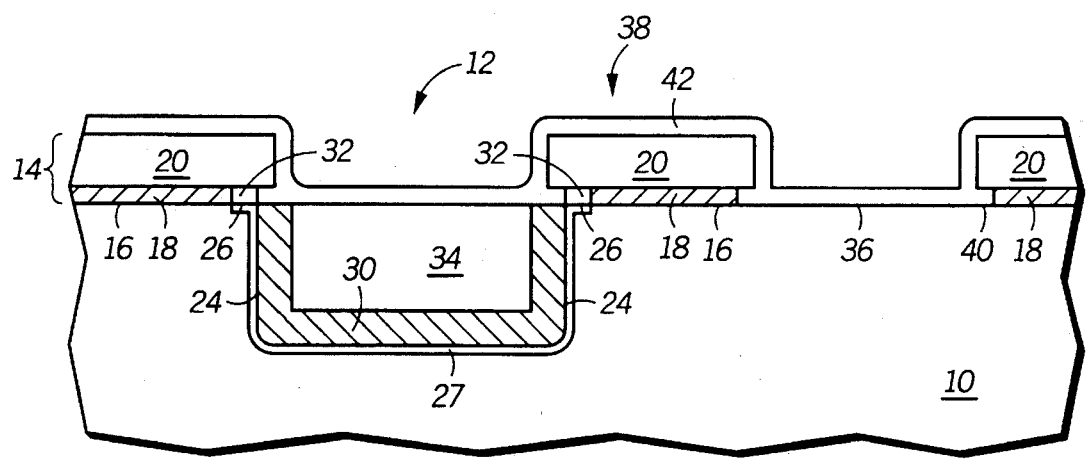
FIGS. 6–7 illustrate, in cross-section, process steps in accordance with an alternative embodiment of the invention.
Figure 7:
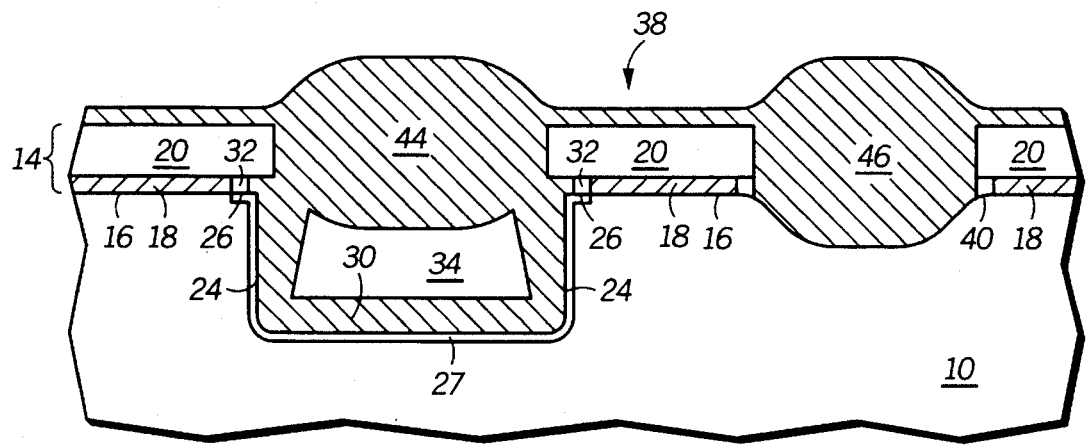

As previously described, the process of the present invention can be used to form a variety of isolation structures in a semiconductor substrate. The process of the present invention can also be used to form isolation regions having different geometric characteristics in close proximity to one another in substrate 10. Accordingly, an alternative embodiment of the present invention is illustrated in FIGS. 6 and 7.

In the alternative embodiment, a shallow isolation region is formed in close proximity to a trench isolation region in substrate 10. Those skilled in the art will appreciate that the formation of a shallow isolation region adjacent to a trench isolation region is advantageous in the fabrication of devices, such as BiCMOS devices, and the like. For example, p-channel and n-channel MOS transistors can be isolated by the shallow isolation region, while vertical bipolar devices can be isolated from the MOS transistors by the trench isolation region. For example, in CMOS or BiCMOS applications, the trench isolation regions can provide inter-well isolation and the shallow isolation regions can provide intra-well isolation.

Accordingly, the inventive process continues with the formation of a photolithographic mask (not shown) overlying masking layer 14. Then, as illustrated in FIG. 6, portions of insulation layer 30 overlying oxidation resistant layer 20 are removed by means of an oxide etching process. Next, using the same photolithographic mask, portions of oxidation resistant layer 20 and pad oxide layer 18 are removed to expose a surface portion 36 of substrate 10. As illustrated in FIG. 6, surface portion 36 is located in proximity to trench 12 and is separated therefrom by a remaining portion 38 of masking layer 14.

An isotropic etching process is carried out to form a second recess 40 in a portion of masking layer 14 adjacent to surface portion 36. The isotropic etching process preferentially removes silicon dioxide, while not substantially etching silicon nitride or polycrystalline silicon. During the isotropic etching process used to form second recess 40, unoxidized portions 32 residing in recess 26 prevent the isotropic etching process from further extending recess 26 along surface 16. Thus, the presence of unoxidized portions 32 effectively prevents the unwanted extension of recess 26 during the formation of second recess 40.

Preferably, after forming second recess 40, a predetermined thickness of silicon dioxide may be grown on silicon substrate 10 prior to the deposition of third oxidizable layer 42. The thermally grown silicon dioxide layer (not shown) will regulate the amount of lateral encroachment of the shallow isolation region to be formed in surface region 36. Usually, reduced lateral encroachment is preferable, however, it may also be advantageous to be able to precisely control the amount of lateral encroachment. Next, third oxidizable layer 42 is formed to overlie masking layer 14, plug 34, and surface portion 36. Third oxidizable layer 42 is conformally deposited and fills second recess 40. Third oxidizable layer 42 also fills exposed portions of recess 26 and contacts remaining portion 32 forming a continuous oxidizable region within recess 26.

After forming third oxidizable layer 42, a field oxidation process is carried out to form trench isolation region 44 and a shallow isolation region 46, as illustrated in FIG. 7. It is important to note that as a result of the previous processing steps, a single thermal oxidation process forms both a shallow isolation region and an oxide body over a deep trench isolation region. The isolation regions are formed simultaneously using a single thermal oxidation process. Trench isolation region 44 is separated from shallow isolation region 46 by remaining portion 38 of masking layer 14. The separation distance between trench isolation region 44 and shallow isolation region 46 is determined, in part, by the photolithographic patterning of masking layer 14. Because the lateral encroachment of isolation regions 44 and 46 is minimized by the inventive isolation forming process, the separation between trench isolation region 44 and shallow isolation region 46 is maintained during the field oxidation process. Thus, the separation distance of the trench isolation region and the shallow isolation region is maintained to substantially that of the pattern defined by masking layer 14, despite the subjection of substrate 10 to a heavy oxidation process.

Figure 8:
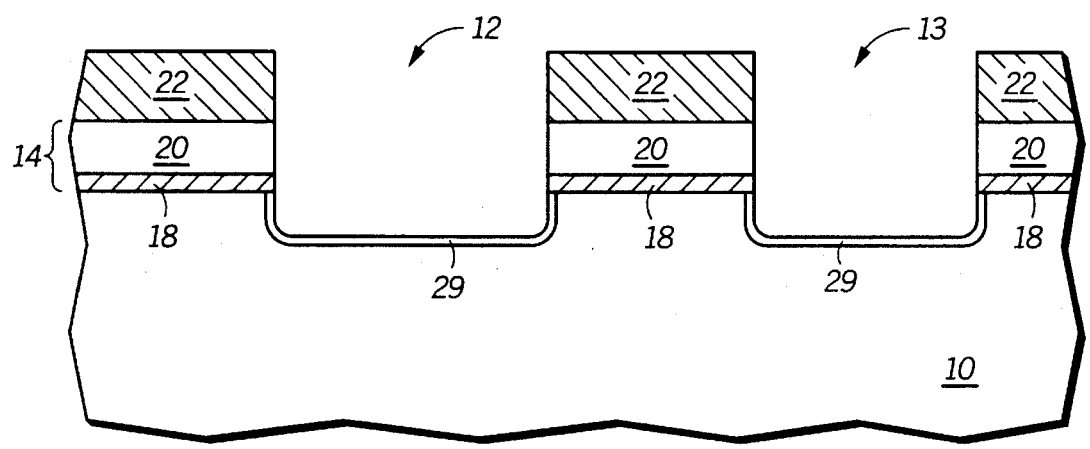
FIGS. 8–11 illustrate, in cross-section, process steps in accordance with a further embodiment of the invention.
Figure 9:
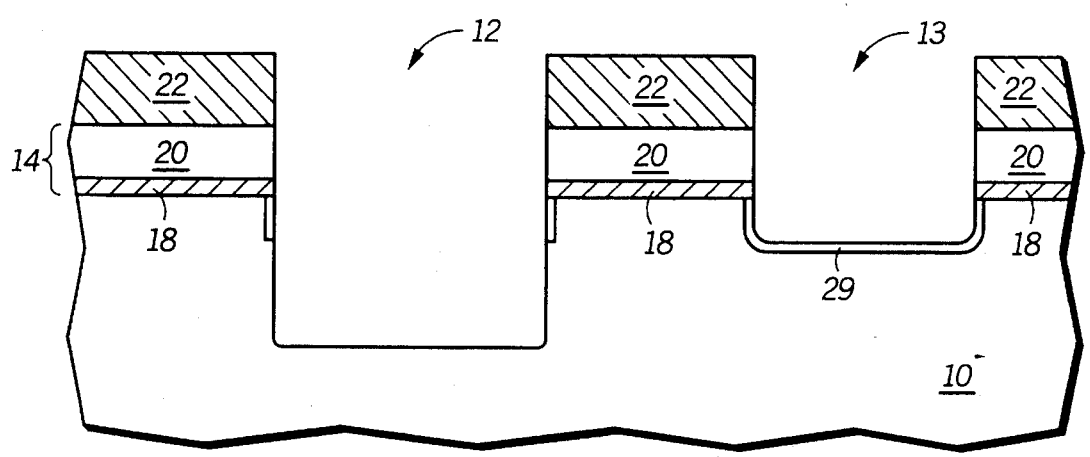
Figure 10:
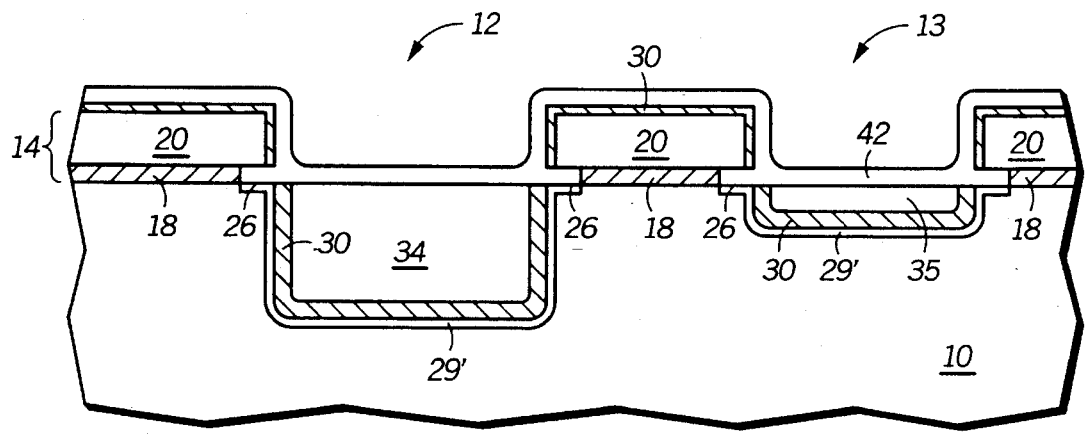

In a further embodiment, the shallow isolation region can be formed in the same manner as the trench isolation region 44. The process to form a shallow trench isolation region is illustrated in FIGS. 8–10.

After patterning masking layer 14, substrate 10 is etched to form a first trench 12 and a second trench 13. The two trenches are initially etched to the same depth and an oxide layer 29 is formed in both trenches. Then, trench 13, which is to form the shallow isolation region, is covered with an etching mask (not shown), and a portion of oxide layer 29 overlying first trench 12 is removed. First trench 12 is then etched to a predetermined depth into substrate 10.

After removing the etch mask, processing continues in a manner similar to the previous processing embodiments. As illustrated in FIG. 10, hard mask 22 is removed and recess 26 is formed at the upper surface of first and second trenches 12 and 13. A reox layer (not shown) is grown overlying first and second trenches 12 and 13 and the surface of recess 26. Then, insulation layer 30 is formed by depositing a first oxidizable layer (not shown) to fill recess 26, and the first oxidizable layer is oxidized to form insulation layer 30. Next, a second oxidizable layer is deposited to fill first and second trenches 12 and 13, and etched to form plugs 34 and 35. After forming plugs 34 and 35, third oxidizable layer 42 is deposited to overlie masking layer 14 and the surface of plugs 34 and 35.

Figure 11:
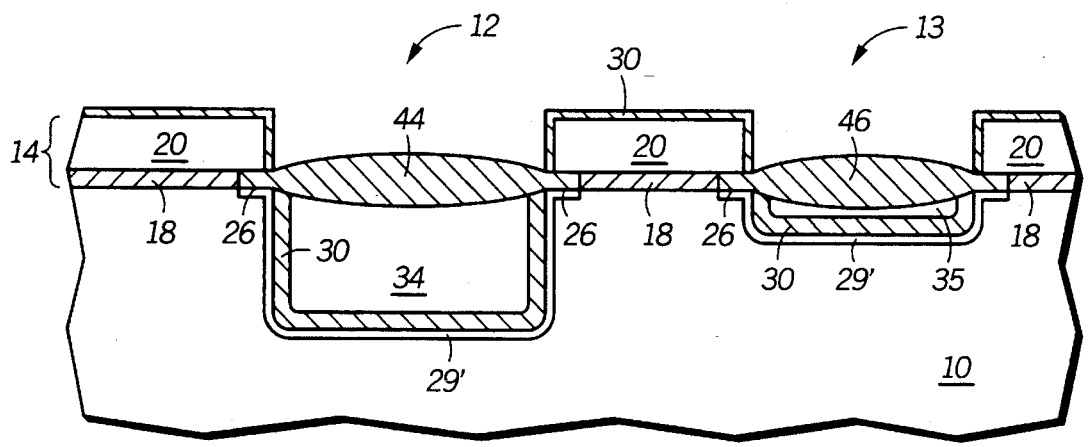

As illustrated in FIG. 11, third oxidizable layer 42 and surface of plugs 34 and 35 are oxidized to isolation regions 44 and 46. The total thickness of isolation regions 44 and 46 can be selected depending upon process requirements. It is important to note that some minimal thickness is necessary is avoid overly thinning the isolation regions during subsequent device processing. The utilization of the process of the invention for the formation of shallow and deep trench isolation regions provides isolation regions requiring less field oxide thickness. Thus, lateral encroachment is reduced and less topographical contrast is obtained.

Those skilled in the art will appreciate that many different arrangements of isolation structures are possible using the process of the present invention. For example, shallow isolation region 46 can be situated between two trench isolation regions and form a continuous isolation region. Further, shallow isolation region 46 can surround the upper surface of trench isolation region 44 forming a continuous isolation structure. A continuous isolation region can be formed by connecting the shallow isolation region with the trench isolation region. To connect the shallow and trench isolation regions, remaining portion 38 are etched away before performing the field oxidation process shown in FIG. 5. Accordingly, all such variations and modifications are within the scope of the present invention.

In the process of the present invention the field oxidation process can be carried out using either an atmospheric oxidation process, or a high pressure oxidation process. In the case of an atmospheric oxidation process, substrate 10 is subjected to a thermal oxidation process carried out in a conventional oxidation furnace. Alternatively, a high pressure oxidation process can be performed. High pressure oxidation is carried out at pressures greater than 1 atmosphere. The use of high pressure oxidation, rather than low pressure oxidation, results in the formation of a very low defect density in substrate 10. The use of high pressure oxidation, in conjunction with third oxidizable layer 42, reduces the oxidation related stress in substrate 10.

Thus it is apparent that there has been provided, in accordance with the invention, an improved method for localized oxidation of silicon, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional silicon dioxide layers can be deposited in intermediate steps in the foregoing embodiments of the invention. It is therefore intended to include within the invention all such variations and modifications as fall within the scope of the appended claims and equivalents thereof.

We claim:

1. A method for fabricating an isolation region in semiconductor device comprising the steps of:

providing a semiconductor substrate having a patterned masking layer thereon, the patterned masking layer including a oxidation resistant layer overlying a dielectric layer;

etching a trench in the semiconductor substrate using the patterned masking layer as an etching mask;

etching a portion of the dielectric layer to form a recess adjacent to the trench;

forming a first oxidizable layer to overlie the trench and the patterned masking layer and filling the recess;

oxidizing the first oxidizable layer to form an insulation layer overlying the trench;

filling the trench with a second oxidizable layer;

forming a third oxidizable layer to overlie the patterned masking layer and the second oxidizable layer; and oxidizing the third oxidizable layer and a portion of the second oxidizable layer to form an isolation region in the trench.

2. The method of claim 1, wherein the step of oxidizing the first oxidizable layer oxidizes a portion of the first oxidizable layer, and leaves an unoxidized portion in the recess.

3. The method of claim 1, wherein the step of oxidizing the third oxidizable layer comprises atmospheric oxidation.

4. The method of claim 1, wherein the step of oxidizing the third oxidizable layer comprises high-pressure oxidation.

5. The method of claim 1, wherein the step of filling the trench comprises chemical vapor deposition of polycrystalline silicon.

6. A method for fabricating an isolation region in a semiconductor device comprising the steps of:

provided a semiconductor substrate having a trench therein, wherein the trench is defined by a patterned masking layer overlying the semiconductor substrate, and wherein the patterned masking layer includes a recess adjacent to the trench;

depositing a first polycrystalline silicon layer to overlie the patterned masking layer and the trench, wherein the first polycrystalline silicon layer fills the recess;

oxidizing the first polycrystalline silicon layer to form a silicon dioxide layer overlying the trench;

depositing a second polycrystalline silicon layer to overlie the silicon dioxide layer and to fill the trench;

depositing a third polycrystalline silicon layer to overlie the second polycrystalline silicon layer; and oxidizing the third polycrystalline silicon layer and a portion of the second polycrystalline silicon layer to form an isolation region in the trench.

7. The method of claim 6 further comprising etching back the second polycrystalline silicon layer to form a plug within the trench.

8. The method of claim 6, wherein the step of oxidizing the third polycrystalline silicon layer comprises atmospheric oxidation.

9. The method of claim 6, wherein the step of oxidizing the third polycrystalline silicon layer comprises high-pressure oxidation.

10. The method of claim 6, wherein the step of oxidizing the first polycrystalline silicon layer comprises oxidizing a portion of the first polycrystalline silicon layer, and leaving an unoxidized portion of the first polycrystalline silicon layer in the recess.

11. A method for fabricating an isolation region in a semiconductor device comprising the steps of:

providing a semiconductor substrate having a trench therein, wherein the trench is defined by a patterned masking layer overlying the semiconductor substrate, and wherein the patterned masking layer includes a first recess adjacent to the trench;

depositing a first polycrystalline silicon layer to overlie the patterned masking layer and the trench, wherein the first polycrystalline silicon layer fills the first recess;

oxidizing the first polycrystalline silicon layer to form a silicon dioxide layer overlying the trench;

depositing a second polycrystalline silicon layer to form a plug in the trench;

removing a portion of the patterned masking layer to expose a portion of the semiconductor substrate;

forming a second recess in the patterned masking layer;

depositing a third polycrystalline silicon layer to overlie the patterned masking layer and the plug, wherein the third polycrystalline silicon layer fills the second recess; and oxidizing the third polycrystalline silicon layer and a portion of the plug to form a first isolation region in the trench, and a second isolation region in the exposed portion of the semiconductor substrate.

12. The method of claim 11, wherein the step of providing a patterned masking layer comprises the step of:

forming a pad oxide layer overlying a surface of the semiconductor substrate;

forming a oxidation resistant layer overlying the pad oxide layer;

forming a photolithographic mask on the oxidation resistant layer; and etching the oxidation resistant layer and the pad oxide layer.

13. The method of claim 12, wherein the step of providing a first recess comprises isotropically etching the pad oxide layer.

14. The method of claim 11, wherein the step of oxidizing the third polycrystalline silicon layer comprises oxidizing a portion of the third polycrystalline silicon layer, and leaving an unoxidized portion of the third polycrystalline silicon layer in the second recess.

15. A method for fabricating an isolation region in semiconductor device comprising the steps of:

providing a semiconductor substrate having a patterned masking layer thereon, the patterned masking layer including a oxidation resistant layer overlying a dielectric layer;

etching first and second trenches in the semiconductor substrate using the patterned masking layer as an etching mask, wherein the first trench is etched to a greater depth in the semiconductor substrate than the second trench;

etching a portion of the dielectric layer to form a recess adjacent to the first and second trenches;

forming a first oxidizable layer to overlie the first and second trenches and the patterned masking layer and filling the recess;

oxidizing the first oxidizable layer to form an insulation layer overlying the first and second trenches;

filling the first and second trenches with a second oxidizable layer;

forming a third oxidizable layer to overlie the patterned masking layer and the second oxidizable layer; and oxidizing the third oxidizable layer and a portion of the second oxidizable layer to form an first isolation region in the first trench and a second isolation region in the second trench.

16. The method of claim 15, wherein the step of providing a patterned masking layer comprises the step of:

forming a pad oxide layer overlying a surface of the semiconductor substrate;

forming a oxidation resistant layer overlying the pad oxide layer;

forming a photolithographic mask on the oxidation resistant layer; and etching the oxidation resistant layer and the pad oxide layer to form two openings therein.

* * * * *